(12) United States Patent
Baba et al.

(10) Patent No.: US 11,304,351 B2
(45) Date of Patent: Apr. 12, 2022

(54) MOUNTING DEVICE, INFORMATION PROCESSING DEVICE, AND MOUNTING METHOD

(71) Applicant: FUJI CORPORATION, Chiryu (JP)

(72) Inventors: Kosei Baba, Chiryu (JP); Shinji Naito, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/968,311

(22) PCT Filed: Mar. 13, 2018

(86) PCT No.: PCT/JP2018/009767
§ 371 (c)(1),
(2) Date: Aug. 7, 2020

(87) PCT Pub. No.: WO2019/175974
PCT Pub. Date: Sep. 19, 2019

(65) Prior Publication Data
US 2021/0084801 A1  Mar. 18, 2021

(51) Int. Cl.
*B23P 19/00* (2006.01)
*H05K 13/08* (2006.01)
*H05K 13/04* (2006.01)

(52) U.S. Cl.
CPC ..... *H05K 13/0812* (2018.08); *H05K 13/0408* (2013.01); *H05K 13/0413* (2013.01); *Y10T 29/53178* (2015.01)

(58) Field of Classification Search
CPC ............ H01L 21/681; H01L 2224/951; H01L 2224/95121; H01L 22/20; H01L 22/26;
(Continued)

(56) References Cited

U.S. PATENT DOCUMENTS

| 6,259,960 B1 * | 7/2001 | Inokuchi ............ G01N 21/9501 250/310 |
| 10,448,548 B2 * | 10/2019 | Eguchi ................. G05B 19/402 |
| 2020/0208817 A1 | 7/2020 | Sugihara |

FOREIGN PATENT DOCUMENTS

| EP | 2 931 014 A1 | 10/2015 |
| WO | WO 2016/020975 A1 | 2/2016 |

OTHER PUBLICATIONS

International Search Report dated May 15, 2018 in PCT/JP2018/009767 filed on Mar. 13, 2018, 2 pages.

* cited by examiner

*Primary Examiner* — Thiem D Phan
(74) *Attorney, Agent, or Firm* — Oblon, McClelland, Maier & Neustadt, L.L.P.

(57) ABSTRACT

The mounting device comprises: a mounting head, having a pickup member picking up a component, which moves and places the component at a placement position by picking up the component with the pickup member from a supply section having a holding member holding the component; an imaging section configured to image the component held by the mounting head; and a control section configured to execute: a first placement process in which the component is picked up by the mounting head, positional deviation is corrected based on imaging results of the component captured by the imaging section, and the component is placed at the placement position, and a second placement process in which the component is placed at the placement position by omitting the imaging process by the imaging section at the mounting head when the positional deviation is within a predetermined allowable range.

10 Claims, 4 Drawing Sheets

(58) Field of Classification Search
CPC .............. G01R 31/01; H05K 13/0413; H05K 13/0813; H05K 3/32; H05K 13/0812; H05K 13/0815; Y10T 29/4913; Y10T 29/53178; Y10T 156/17; Y10T 29/53174
USPC .......... 29/740, 720, 729, 739, 829, 832, 833
See application file for complete search history.

MOUNTING DEVICE, INFORMATION PROCESSING DEVICE, AND MOUNTING METHOD

TECHNICAL FIELD

In this specification, a mounting device, an information processing device, and a mounting method are disclosed.

BACKGROUND ART

Conventionally, a mounting device has been provided, in which an image of the light emitting component is obtained by capturing the image with respect to an imaging range including an illuminant of the light emitting component so that the center coordinate of the illuminant is detected based on the image for holding the light emitting component, of which imaging is performed without using any information about the outer shape of the light emitting component itself (e.g., see Patent Literature 1). In this mounting device, it is possible to accurately position the illuminant on the board without relying on information related to the outer shape of the light emitting component based on the light emitting component image.

PATENT LITERATURE

Patent Literature 1: International Publication No. WO 2016/020975

BRIEF SUMMARY

Technical Problem

However, in the mounting device of Patent Literature 1 described above, components which are not light emitting components are not considered. Generally, in a mounting device, a component is moved to a position above an imaging device and, after imaging, disposed at a placement position on a board. Such movement gives rise to a problem in which time required for the mounting process increases.

The present specification has been made in view of such a problem, and it is a main object of the present disclosure to provide a mounting device, an information processing device, and a mounting method that can shorten the time required for performing a mounting process while ensuring mounting accuracy.

Solution to Problem

The mounting device, the information processing device, and the mounting method of the present disclosure adopt the following means to achieve the main object described above.

The mounting device disclosed in this specification comprises: a mounting head, having a pickup member picking up a component, which moves and places the component at a placement position by picking up the component with the pickup member from a supply section having a holding member holding the component; an imaging section configured to image the component held by the mounting head; and a control section configured to execute: a first placement process in which the component is picked up by the mounting head, positional deviation is corrected based on imaging results of the component captured by the imaging section, and the component is placed at the placement position, and a second placement process in which the component is placed at the placement position by omitting the imaging process by the imaging section at the mounting head when the positional deviation is within a predetermined allowable range.

In this mounting device, the first placement process is executed in which the component is picked up by the mounting head, positional deviation is corrected using imaging results of the component captured by the imaging section, and the component is placed at the placement position. On the other hand, in this mounting device, the second placement process is executed in which the component is placed at the placement position by omitting the imaging process by the imaging section of the mounting head when the positional deviation is within a predetermined allowable range. In this mounting device, mounting accuracy is ensured by correcting the positional deviation using the imaging results from the imaging section, whereas it is possible to shorten the time required for the mounting process by omitting the imaging process and, additionally, omit moving of the mounting head to the imaging section when a predetermined mounting accuracy can be ensured. The "predetermined allowable range" may be empirically determined as a range of the positional deviation amount in which a problem does not occur after the placement of a component (e.g., after reflow processing). Further, the control section omits the passage of the mounting head at the imaging section and executes the second placement process in which the mounting head is directly moved from the component pickup position to the placement position.

DESCRIPTION OF EMBODIMENTS

Figure 1:
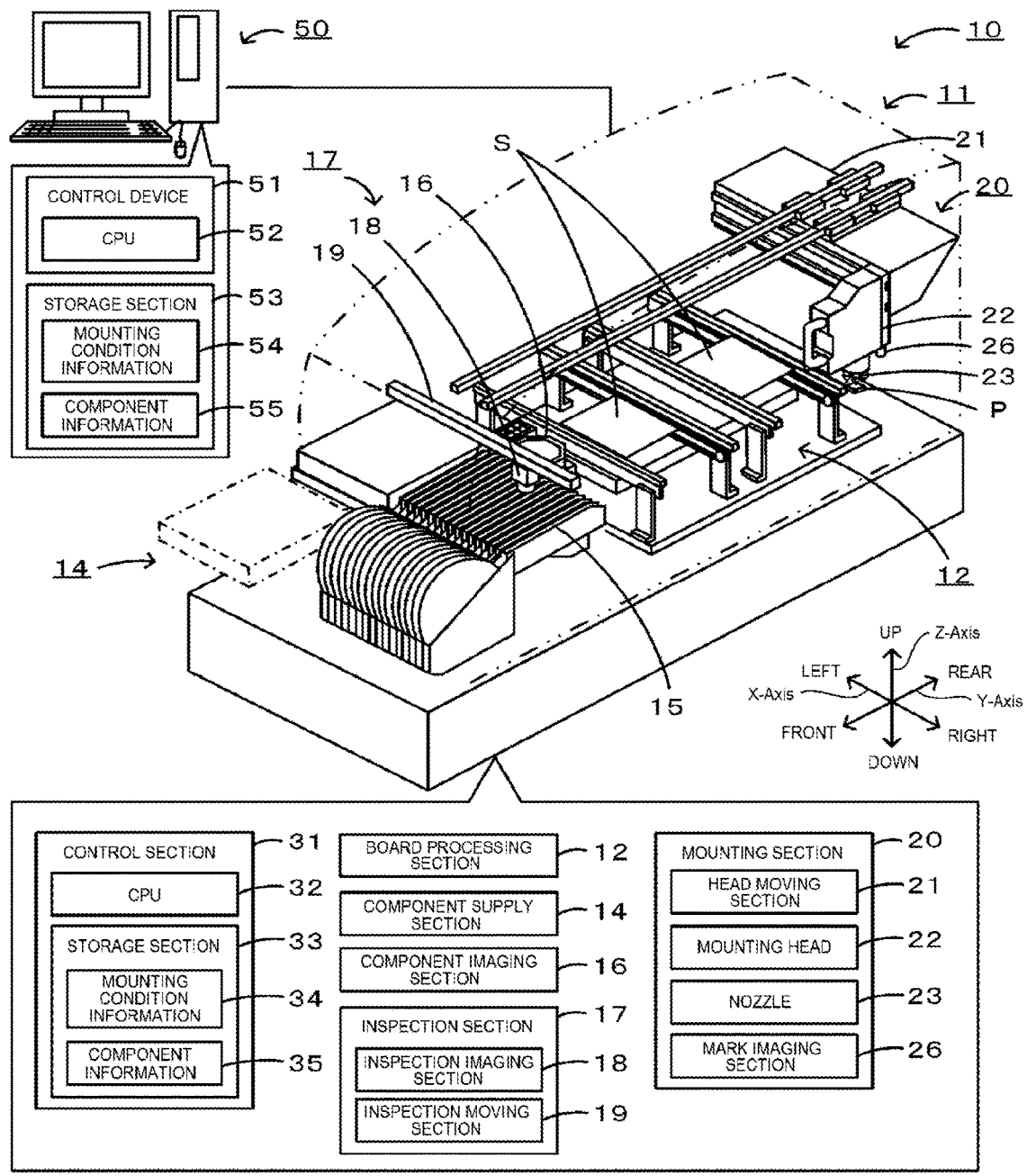
FIG. 1 A schematic diagram showing an example of mounting system 10.
Figure 2:
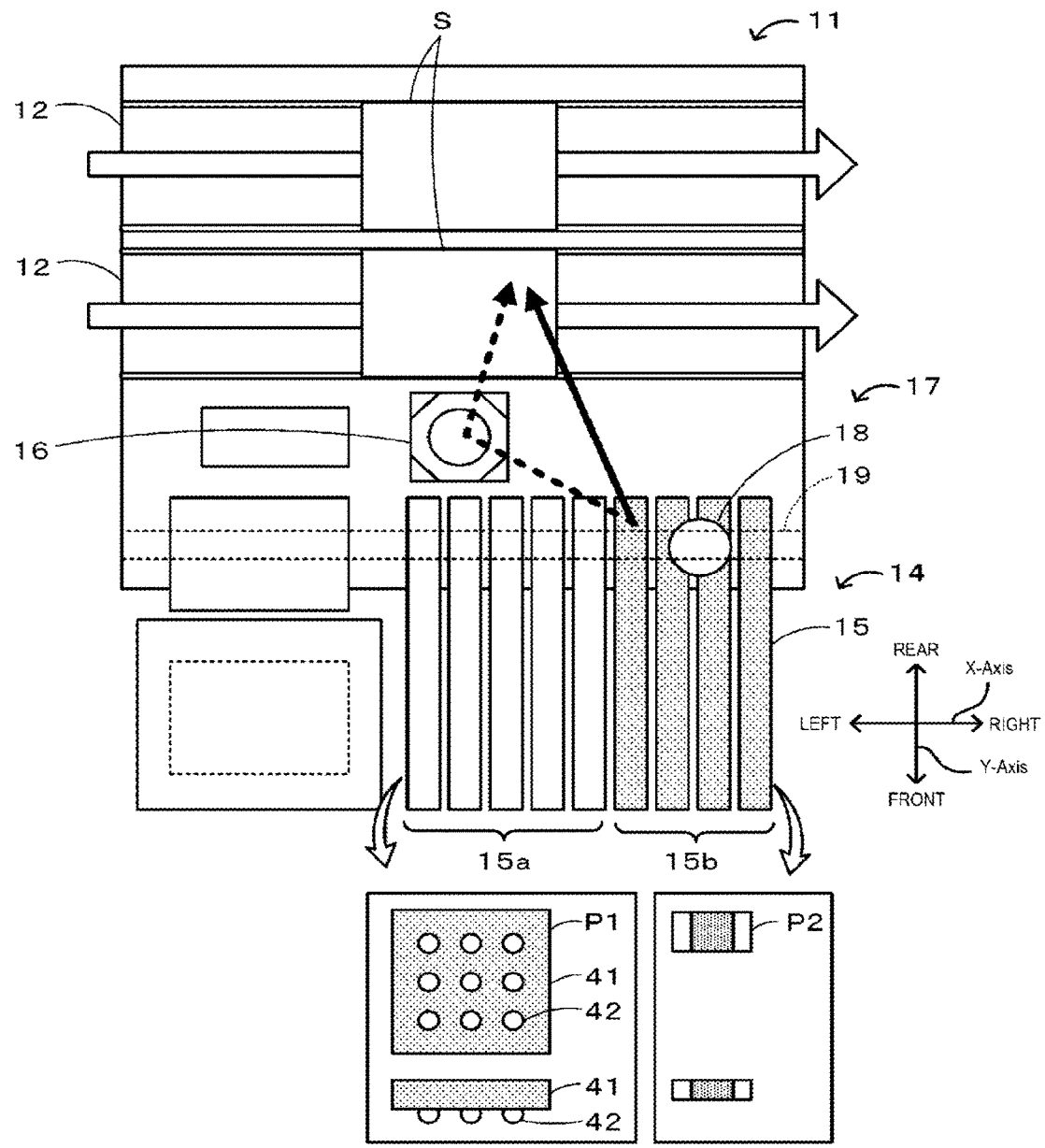
FIG. 2 A diagram showing board processing section 12 and component supply section 14.

The present embodiment will be described below with reference to the drawings. FIG. 1 is a schematic diagram of mounting system 10 that is an example of the present disclosure. FIG. 2 is a diagram showing board processing section 12 and component supply section 14. Mounting system 10 is a system for executing a process of mounting component P on board S, for example. Mounting system 10 includes mounting device 11 and management computer (PC) 50. Mounting system 10 is configured as a mounting line in which multiple mounting devices 11 for mounting component P on board S are arranged from upstream to downstream. In FIG. 1, only one mounting device 11 is shown for convenience of description. In the present embodiment, the left-right direction (X-axis), the front-rear direction (Y-axis), and the up-down direction (Z-axis) are as shown in FIGS. 1 and 2.

Mounting device 11, as shown in FIG. 1, is provided with board processing section 12, component supply section 14, component imaging section 16, inspection section 17, mounting section 20, and control section 31. Board processing section 12 is a unit for conveying in, conveying, fixing at a mounting position, and conveying out board S. Board processing section 12 has a pair of conveyor belts provided at intervals in the front and rear of FIG. 1 and spanning the lateral direction. Board S is conveyed by these conveyor belts.

Component supply section 14 is a unit for supplying component P to mounting section 20. Component supply section 14 is provided with multiple reels and is detachably attached to the mounting section at the front of mounting device 11. A tape that serves as a holding member for holding components is wound to each reel, and multiple components P are held to the surface of the tape along the longitudinal direction of the tape. The tape is unwound from the reel toward the rear, with the components exposed, and is fed by feeder 15 to a pickup position from which mounting head 22 picks up the component. Component supply section 14 may be provided with a tray unit having a tray as a holding member on which multiple components are arranged and placed.

Components P used in mounting device 11 includes component P1 requiring inspection in component imaging section 16 and component P2 that can be inspected on component supply section 14 (see FIG. 2). Component P1 has main body 41 and bumps 42. Bumps 42 are electrodes arranged in a large number on the underside of plate-shaped main body 41. Component P2 is a chip component in which inspecting of shapes and positions (e.g., wiring and contacts) is possible on component supply section 14. Component P2 can also be inspected in component imaging section 16. Here, a component having bumps 42 was presented as an example of component P1, but component P1 is not particularly limited to this so long as the component requires an inspection in component imaging section 16. Further, although a chip component was presented as an example of component P2, component P2 may be another component, such as a component with multiple leads, as long as the component can be inspected on component supply section 14.

Component imaging section 16, as shown in FIGS. 1 and 2, is a device for capturing an image of one or more components P picked up and held by mounting head 22. Component imaging section 16 is disposed between component supply section 14 and board processing section 12. The imaging range of component imaging section 16 is above component imaging section 16. Component imaging section 16 captures an image of component P when mounting head 22 holding component P passes above component imaging section 16 and outputs the captured image to control section 31. Control section 31 can check whether the shape and position of component P are normal, detect the amount of positional deviation at the time of picking up component P, and the like based on the captured image.

Inspection section 17 is a unit for inspecting component P on component supply section 14. Inspection section 17 has inspection imaging section 18 and inspection moving section 19. Inspection imaging section 18 is for imaging component P on component supply section 14 and is provided above component supply section 14. The imaging range of inspection imaging section 18 is below inspection imaging section 18. Further, inspection imaging section 18 can image two or more feeders 15 in one field of view. Inspection moving section 19 is for moving inspection imaging section 18 in the X-axis direction above component supply unit 14 (i.e., in the lateral direction of the device), and has a guide and a driving section. Inspection imaging section 18 is moved to the inspection position by inspection moving section 19.

Mounting section 20 is a unit for picking up component P from component supply section 14 and positioning component P on board S fixed to board processing section 12. Mounting section 20 is provided with head moving section 21, mounting head 22, and nozzle 23. Head moving section 21 is provided with a slider that moves in the XY direction, guided by guide rails, and a motor for driving the slider. Mounting head 22 picks up multiple components P and is moved in the XY direction by head moving section 20. Mounting head 22 is detachably attached to slider. One or more nozzles 23 are detachably attached to the lower face of mounting head 22. Mounting head 22 can be attached with multiple nozzles 23 for picking up components P along the circumference. Nozzle 23 is for picking up components by the use of negative pressure. The pickup member for picking up component P may be a mechanical chuck for mechanically holding component P instead of nozzle 23. Mark imaging section 26 is disposed on the underside of mounting head 22. Mark imaging section 26 moves in the XY direction, along with the movement of mounting head 22, and images a mark or the like formed on board S.

Control section 31 is configured as a microprocessor with a centralized CPU 32 and is provided with storage section 33 for storing various data. Control section 31 outputs control signals to board processing section 12, component supply section 14, component imaging section 16, inspection section 17 and mounting section 20, and receives control signals from mounting section 20, component supply section 14, component imaging section 16, and inspection section 17. Storage section 33 stores mounting condition information 34, which includes component information, placement orders and placement positions for mounting components to board S, and the like; and component information 35, which consists of a database related to components P and the like. Control section 31 causes mounting head 22 to pick up component P, performs correction of positional deviation using the imaging results obtained by imaging component P with component imaging section 16, and executes a first placement process of placing component P at a placement position. Further, control section 31 executes a second placement process of placing component P at a placement position by omitting the imaging process in component imaging section 16 of mounting head 22 when the inspection results are good, that is, when the positional deviation of mounting head 22 is within a predetermined allowable range.

Management PC 50 is a computer that manages information for each device of mounting system 10. As shown in FIG. 1, management PC 50 is provided with control section 51, storage section 53, a display section, and an input device. Control section 51 is configured as a microprocessor with a centralized CPU 52. Storage section 53 is a device, such as an HDD, for storing various types of data, such as a processing program. The display section is a liquid crystal screen for displaying various types of information. The input device includes a keyboard and a mouse for an operator to input various instructions. Management PC 50 generates mounting condition information 54 including the conditions for mounting component P using information of board S to be manufactured, component information 55, and the like. Storage section 53 stores mounting condition information 54 similar to mounting condition information 34 and component information 55, which includes information of component P. Component information 55 includes component ID, component size, component type, inspection necessity information, information of nozzles capable of picking up the components, imaging conditions used in imaging the components, and the like. The inspection necessity information includes, for example, information on whether an inspection is required before placement, whether an inspection is required in component imaging section 16, whether the inspection can be performed in inspection section 17, and the like.

Figure 3:
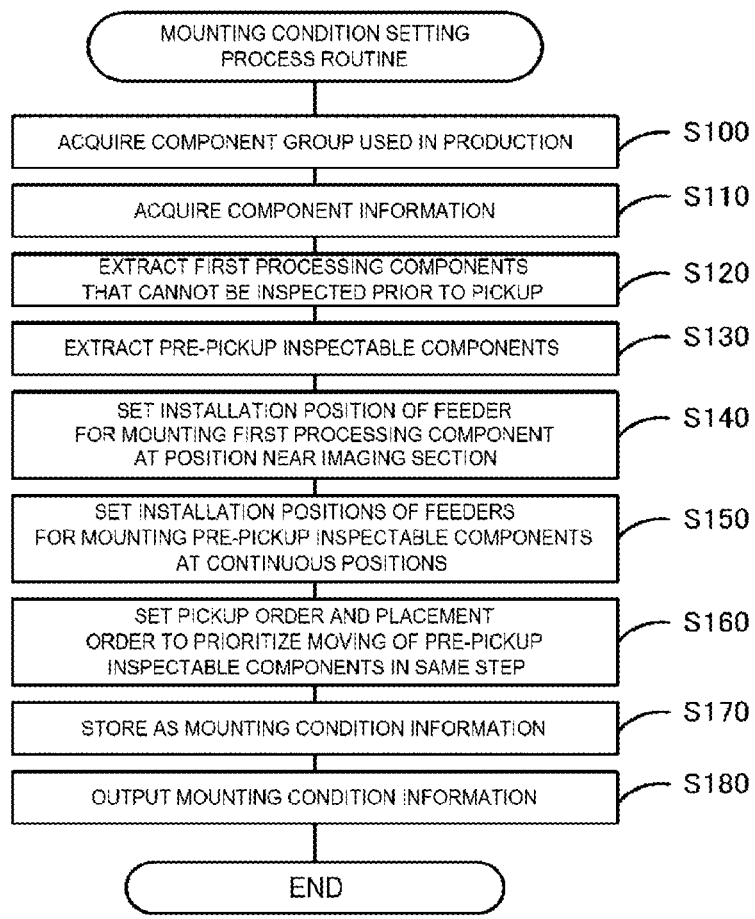
FIG. 3 A flowchart showing an example of a mounting condition setting process routine.

Next, the operation of mounting system 10 of the present embodiment configured in this way, starting with the process of setting the mounting condition information, will be described. FIG. 3 is a flowchart showing an example of a mounting condition setting process executed by CPU 52 of control section 51. This routine is stored in storage section 53 and is executed by instructions from an operator. When this routine is executed, CPU 52 acquires a component group used in producing board S (S100). This process can be performed, for example, by reading a design drawing of board S. Next, CPU 52 acquires component information 55 by reading from storage section 53 (S110). Next, from components P used in production of board S, CPU 52 extracts components P1 (also referred to as first processing components) which cannot be inspected prior to pickup by mounting head 22 but require inspection in component imaging section 16 (S120) and extracts components P2 (also referred to as pre-pickup inspectable components) which can be inspected by inspection section 17 prior to pickup by mounting head 22 (S130). CPU 52 performs this extraction process based on the inspection necessity information included in component information 55.

Next, CPU 52 sets the feeder installation position for installing feeder 15 (also referred to as first processing target feeder 15a), having a holding member holding the first processing component, to a position close to component imaging section 16 (S140). Since components P1 require inspection in component imaging section 16, in this setting, it is possible to further suppress an increase in the distance moved by mounting head 22. Further, CPU 52 sets feeder installation positions for installing multiple feeders 15 (also referred to as second processing target feeder 15b) at contiguous positions (S150), each feeder 15 having a holding member holding a pre-pickup inspectable component. Components P2 may need to be inspected in component supply section 14, and in this setting, as many second processing target feeders 15b are imaged as possible and inspected.

Subsequently, CPU 52 sets a pickup order and placement order (also referred to as a mounting order) in which the pre-pickup inspectable components are preferentially picked up and moved in the same step (S160). Note that the "same step" means, for example, a step in which mounting head 22 picks up one or more components P, moves the components P, places the components P, and returns. When only the pre-pickup inspectable components that can be inspected in component supply section 14 are picked up by mounting head 22, it is highly likely that the inspection in component imaging section 16 can be omitted. In addition, in S160, CPU 52 may set the mounting order to an alternative priority order in which the moving distance or the time required for moving mounting head 22 is shorter. Incidentally, the pre-pickup inspectable components may have a tendency to be picked up together in the same process, and the mounting order may be moved forward (upper) or backward (lower) with respect to the entire order.

CPU 52 then stores mounting condition information 54 including feeder installation positions and pickup order, set as described above, in storage section 53 (S170), outputs mounting condition information 54 to mounting device 11 (S180), and then ends the routine. Mounting device 11 that acquires mounting condition information 54 stores the acquired information in storage section 33 as mounting condition information 34. Further, mounting device 11 makes a notification to the operator by displaying the mounting positions of first processing target feeder 15a and second processing target feeder 15b on the display of the operation panel or the like. In preparation for production, the operator performs an operation of installing feeder 15 to component supply section 14 based on the notification information.

Figure 4:
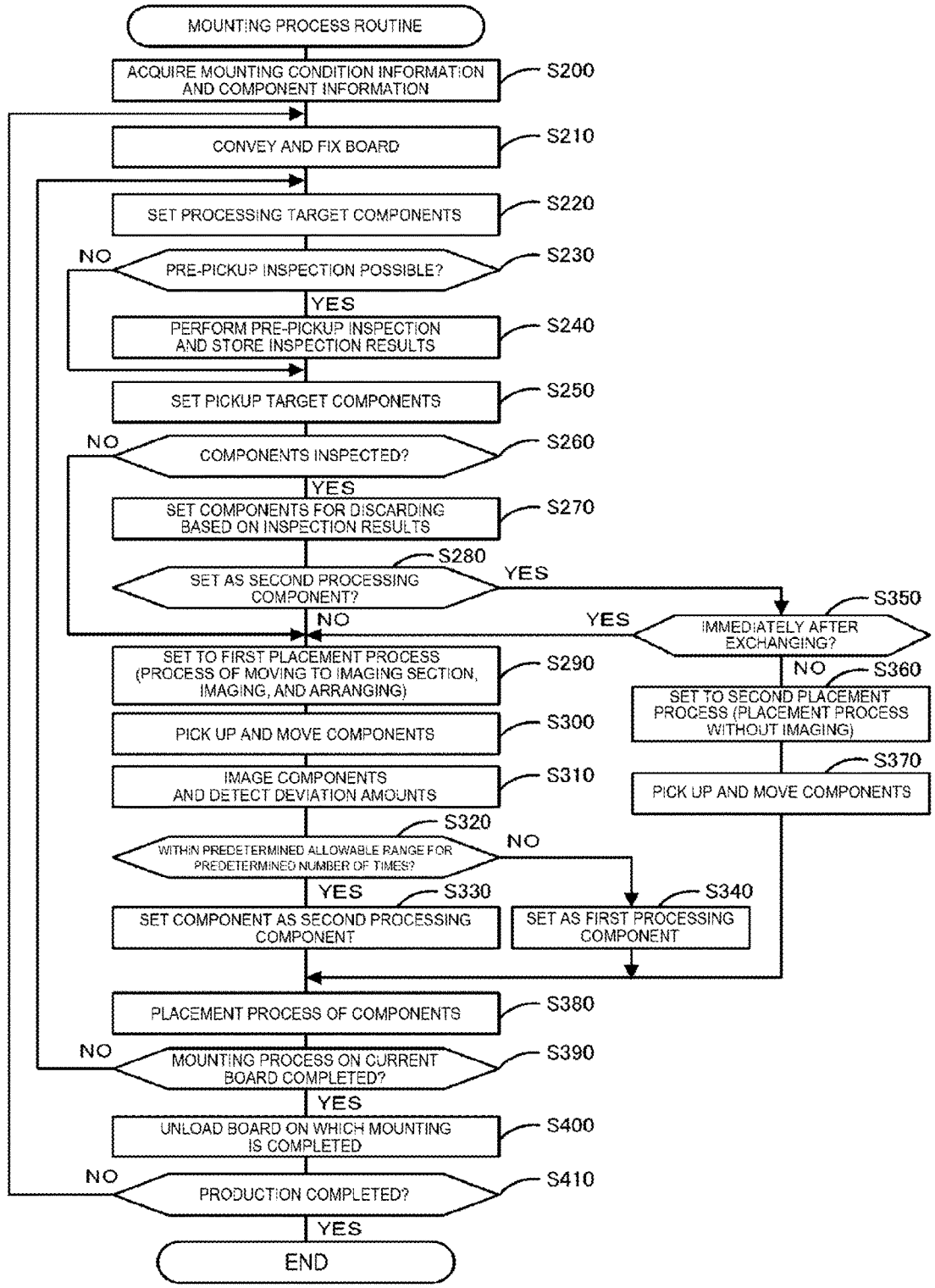
FIG. 4 A flowchart showing an example of a mounting process routine.

Next, the mounting process executed by mounting device 11 will be described. FIG. 4 is a flowchart showing an example of a mounting routine executed by CPU 32 of control section 31. This routine is stored in storage section 33 and is executed by an instruction from an operator. Here, a case will be described in which an instruction permitting the second placement process is inputted to mounting device 11 by an operator. When this routine is executed, CPU 32 reads and acquires mounting condition information 34 and component information 35 (S200), and causes board processing section 12 to perform the process of conveying and fixing board S (S210). Next, CPU 32 sets processing target components based on the mounting order in mounting condition information 34 (S220). Here, the processing targets are components P to be inspected on component supply section 14 by inspection section 17 prior to the pickup process. Next, CPU 32 determines whether processing target components P can be inspected on component supply section 14 prior to pickup by mounting head 22 (S230), and when components P can be inspected, inspection section 17 executes the inspection of components P and stores the inspection result in storage section 33 (S240). Inspection section 17 images component P on component supply section 14 with inspection imaging section 18 and outputs the imaging result to control section 31. For example, control section 31 performs an inspection process of component P including whether the outer shape or the position is normal by matching with the reference shape of component P included in component information 35.

After S240 or when processing target components P cannot be inspected prior to pickup in S230, CPU 32 sets processing target components P based on the mounting order from mounting condition information 34 (S250). In order for pickup target components P to be picked up by mounting head 22 after being inspected in S240, pickup target components P may be set after a predetermined time has elapsed after processing target components have been set. Further, one or more components P picked up in the same step of mounting head 22 are set as pickup target components P. When pickup target components P are set, CPU 32 determines whether all of the components have been inspected (S260) and, when all of pickup target components P set have been inspected, CPU 32 sets whether the components P are usable or are discarding targets based on the inspection result (S270). Next, CPU 32 determines whether all of pickup target components P are set as second processing components (S280). Second processing components refer to components P that have been inspected before pickup on component supply section 14 and for which the positional deviation amount at the time of pickup by mounting head 22 in feeder 15 holding component P is within a predetermined allowable range for a predetermined number of times. For such components P, the imaging process in component imaging section 16 can be omitted since such components P do not require inspection nor detection of positional deviation at the time of pickup in component section 16. Setting of the second processing components is performed for each mounting section of component supply section 14 to which second processing target feeder 15b is installed.

When part or all of pickup target components P are not set as second processing components, CPU 32 sets pickup target components P to the first placement process (S290). The first placement process is a process in which mounting head 22 is moved to a position above component imaging section 16, a correction is performed of the positional deviation using the imaging result obtained by imaging by component imaging section 16, and component P is placed at a placement position. Subsequently, CPU 32 performs a process of picking up and moving pickup target component P (S300). When this occurs, CPU 32 causes mounting head 22 to move to the pickup position of component supply section 14, causes nozzle 23 to pick up component P, and then moves mounting head 22 to a position above component imaging section 16. Next, CPU 32 causes component imaging section 16 to image component P held by mounting head 22 and detects the positional deviation (S310). CPU 32 can detect the positional deviation amount by obtaining the difference between the positional relationship (coordinates) of the reference point in the center of the captured image and the center point of nozzle 23 and the positional relationship (coordinates) of the reference point and the center point of the component. In addition, CPU 32 also performs the inspection process of components P using the captured images when there are components among components P held by mounting head 22 which have not been inspected prior to pickup.

Next, CPU 32 determines whether the detected positional deviation amounts of picked up components P are within a predetermined allowable range for a predetermined number of times (S320). The "predetermined number of times" may be determined empirically as the number of times (e.g., 5 times, 10 times, etc.) to ensure a desired mounting accuracy. Further, the "predetermined allowable range" may be empirically determined to be a range of a positional deviation amount that ensures a desired mounting accuracy, for example, a range of a positional deviation amount in which a problem does not occur after the placement of a component (for example, after reflow processing). The term "for a predetermined number of times" need only satisfy a predetermined number of times and need not be consecutive, but it is preferable to satisfy the requirement in a consecutive manner. When a detected positional deviation amount is within a predetermined allowable range over a predetermined number of times, the component P is linked to feeder 15 holding the component P and set as a second processing component (S330). On the other hand, when there is no component P whose positional deviation amount is within a predetermined allowable range over a predetermined number of times in S320, the component P is linked to feeder 15 holding the corresponding component P and set as a first processing component (S340). CPU 32 performs a placement process of components P after S330 or S340 (S380). CPU 32 performs a placement process of arranging components P at positions where the detected positional deviation amount is corrected.

On the other hand, in S280, when all of pickup target components P are set as second processing components, CPU 32 determines whether components P picked up from feeder 15 immediately after exchanging is included in the second processing components (S350). CPU 32 makes this determination by obtaining information from feeders 15. When there is a component P picked up from feeder 15 immediately after exchanging, CPU 32 determines that a desired mounting accuracy cannot be ensured in some cases and performs S290 and subsequent processes, that is, CPU 32 executes the first placement process in which the imaging process in component imaging section 16 is performed and positional deviation is detected. On the other hand, when there is no feeder 15 immediately after exchanging in S350, CPU 32 sets pickup target components P to perform the second placement process for performing the placement process while omitting the movement to component imaging section 16 and the imaging process (S360). Subsequently, CPU 32 executes a pickup process and a moving process of processing target component P (S370) and executes a placement process (second placement process) of component P in S380. In the second placement process, mounting head 22 is directly moved from the pickup position to the placement position, and the placement process is performed (see solid line arrow in FIG. 2). Therefore, in mounting device 11, it is not necessary to move mounting head 22 to a position above component imaging section 16 as in the first placement process (see dotted line arrows in FIG. 2), and the imaging process of the captured image in component imaging section 16 (detection of the positional deviation amount) is also not necessary to perform.

After S380, CPU 32 determines whether the mounting process of the current board has been completed (S390), and if the mounting process has not been completed, executes the processes from S220 onward. That is, CPU 32 executes the subsequent pre-pickup inspection, sets component P to be picked up, and executes the first placement process or the second placement process. On the other hand, if the mounting process of the current board has been completed in S390, CPU 32 causes board processing section 12 to discharge board S on which mounting has been completed (S400), and determines whether production has been completed (S410). If production has not completed, CPU 32 executes the processes from S210 onward, and if production has been completed, CPU 32 terminates the routine.

Here, the correspondence between constituent elements of the present embodiment and constituent elements of the present disclosure will be described. Mounting head 22 of the present embodiment corresponds to a mounting head of the present disclosure, component imaging section 16 corresponds to an imaging section, control section 31 corresponds to a control section, inspection section 17 corresponds to an inspection section, component supply section 14 corresponds to a supply section, nozzle 23 corresponds to a pickup member, the tape and the tray correspond to holding members. Management PC 50 corresponds to an information processing device, and control section 51 corresponds to a setting section. In the present embodiment, an example of the mounting method is also disclosed by describing the operation of mounting device 11.

In mounting device 11 of the present embodiment described above, mounting head 22 is made to pick up component P, correction of positional deviation is performed using the imaging results obtained by imaging component P with component imaging section 16, and a first placement process is executed in which component P is placed at a placement position. On the other hand, in mounting device 11, the second placement process is executed in which component P is placed at the placement position by omitting the imaging process by component imaging section 16 of mounting head 22 when the positional deviation is within a predetermined allowable range. In mounting device 11, mounting accuracy is ensured by correcting the positional deviation using the imaging results from component imaging section 16, whereas it is possible to shorten the time required for the mounting process by omitting the imaging process and, additionally, omit moving of mounting head 22 to component imaging section 16 when a predetermined mounting accuracy can be ensured.

Further, control section 31 executes the second placement process after it is confirmed that the positional deviation amount is within a predetermined allowable range for a predetermined number of times. In mounting device 11, it is possible to further suppress the deterioration of the mounting accuracy. Further, control section 31 executes the second placement process when an instruction permitting the second placement process is obtained from an operator. In mounting device 11, it is possible to further shorten the time required for the mounting process after obtaining consent from the operator. Furthermore, control section 31 executes the first placement process when picking up components P from the exchanged holding member after the holding member of component supply section 14 is exchanged during execution of the second placement process. In mounting device 11, when component P is exchanged with a new component P, the positional deviation amount and the like of component P may change. In mounting device 11, since the positional deviation correction is performed without omitting the imaging process of component P after component P is exchanged, it is possible to further suppress deterioration of the mounting accuracy.

After inspection of component P is performed by inspection section 17, control section 31 performs the first placement process or the second placement process. In mounting device 11, in addition to calculating the positional deviation amount using the captured image from component imaging section 16, the shape of component P or the like may be inspected. In mounting device 11, since components P are inspected on component supply section 14, it is possible to omit the inspection using the captured image from component imaging section 16, and while inspecting the components P, it is possible to further shorten the time required for the mounting process. Further, inspection section 17, having inspection imaging section 18 (imaging device) for capturing images on component supply section 14, executes inspection of components based on captured images. In mounting device 11, it is possible to inspect component P using the captured image of component supply section 14. Furthermore, component supply section 14 is installed with multiple holding members in a contiguous manner, each of the holding members holding component P on which the second placement process can be executed. In mounting device 11, since components P to be inspected in component supply section 14 are arranged contiguously, the inspection can be performed smoothly. Furthermore, control section 31 causes mounting head 22 to pick up components P in a mounting order in which multiple components P are held, the components P being components on which the second placement process can be executed. In mounting device 11, image processing is suppressed as much as possible by not making mounting head 22 hold components P (P2) not requiring imaging mixed in with components P (P1) requiring imaging. In mounting device 11, the time required for the mounting process can be further reduced.

Further, management PC 50 sets the mounting order in which mounting head 22 holds multiple components P on which the second placement process can be executed. In management PC 50, image processing is suppressed as much as possible by not making mounting head 22 hold components P (P2) not requiring imaging mixed in with components P (P1) requiring imaging. Management PC 50 can further reduce the amount of time it takes to perform the mounting process. Furthermore, management PC 50 sets the mounting position in component supply section 14 of multiple holding members at contiguous positions, each holding member holding component P on which the second placement process can be executed. In management PC 50, since components P requiring inspection in component supply section 14 are arranged contiguously, it is easy to inspect the components P.

It is needless to say that the present disclosure is not limited to the above-described embodiment and may be implemented in various forms as long as those forms fall within the technical scope of the present disclosure.

For example, in the embodiment described above, components P (P1, P2) have been described as including component P1 and component P2 that require inspection but may further include components that do not require inspection. In a component that does not require inspection, the second placement process may be performed when the positional deviation amount falls within a predetermined allowable range regardless of whether the inspection is performed. Also in mounting device 11, it is possible to further shorten the time required for the mounting process while ensuring mounting accuracy.

In the embodiment described above, the second placement process is executed when an instruction permitting the second placement process is obtained from the operator, but the present disclosure is not particularly limited thereto, and the obtaining of permission from the operator may be omitted and the second placement process may be executed provided the condition is satisfied.

In the embodiment described above, inspection section 17 was described as performing the inspection of component P using the captured image from inspection imaging section 18, but the disclosure is not particularly limited thereto, and, for example, the appearance (shape or position) of the component may be detected with a contact type or non-contact sensor or the like. The contact-type sensor may be, for example, a measuring sensor of electrical resistance or a weight measuring sensor. The non-contact type sensor may be a sensor utilizing light reflection.

In the embodiment described above, in S360, the installation position of feeder 15 is focused on for setting a second processing component, however, the disclosure is not particularly limited thereto, and feeder 15 itself may be considered for setting a second processing component, by which the process of S350 may be omitted.

In the embodiment described above, the mounting order is set in which multiple components P are held by mounting head 22, the components P being components on which the second placement process can be executed, but the present disclosure is not particularly limited thereto, and this setting may be omitted. Also in mounting device 11, it is possible to further shorten the time required for the mounting process while ensuring mounting accuracy.

In the embodiment described above, components P on which the second placement process can be executed are mounted contiguously on component supply section 14, but the present disclosure is not particularly limited thereto and this setting may be omitted. Also in mounting device 11, it is possible to further shorten the time required for the mounting process while ensuring mounting accuracy.

The present disclosure has been described as mounting device 11, but a mounting method or a program for implementing a mounting method may be used. Further, the present disclosure has been described as a management PC 50, but a method of setting mounting condition information or a program for implement a setting method may be used.

The mounting device, the information processing device, and the mounting method of the present disclosure may be configured as follows. In the mounting device of the present disclosure, the control section may execute the second placement process after confirming that the positional deviations are within a predetermined allowable range for a predetermined number of times. In this mounting device, it is possible to further suppress the deterioration of the mounting accuracy. The "predetermined number of times" may be empirically determined as the number of times to ensure a desired mounting accuracy.

In the mounting device of the present disclosure, the control section may execute the second placement process when an instruction permitting the second placement process is acquired from an operator. In this mounting device, it is possible to further shorten the time required for the mounting process after obtaining consent from the operator.

In the mounting device of the present disclosure, the control section may execute the first placement process when picking up a component from an exchanged holding member after a holding member of the supply section is exchanged during execution of the second placement process. In the mounting device, when a component is exchanged with a new component, the positional deviation of the component and the like may change. In this mounting device, since the positional deviation correction is performed without omitting the imaging process of the component after the component is exchanged, it is possible to further suppress deterioration of the mounting accuracy.

The mounting device of the present disclosure may be a mounting device having an inspection section configured to inspect a component on the supply section, the component being a component requiring inspection before placement, and the control section executes the first placement process or the second placement process after the inspection of the component is performed by the inspection section. In the mounting device, in addition to calculating the positional deviation amount using the captured image from the imaging section, the shape of the component or the like may be inspected. In this mounting device, since components are inspected on component supply section, it is possible to omit the inspection using the captured image from the imaging section, and while inspecting the components, it is possible to further shorten the time required for the mounting process. Here, the inspection section may inspect the appearance (shape, position, or the like) of the component or the presence or absence of a member (e.g., wiring) connected to the component or the shape thereof. Further, the inspection section may be made to inspect by capturing an image of the component or may be made to inspect the inspection site of the component with a contact-type, non-contact-type sensor, or the like.

In the mounting device of the present disclosure provided with the inspection section, the supply section is installed with multiple holding members holding components on which the second placement process can be executed, and the inspection section has an imaging device configured to capture an image of the top of the supply section and execute inspection of the component based on the captured image. In the mounting device, it is possible to inspect components using a captured image at the supply section. Here, the supply section may be configured to contiguously install multiple holding members, each holding member holding a component on which the second placement process can be executed. In this mounting device, since the components to be inspected in the supply section are arranged contiguously, the inspection can be performed smoothly.

In the mounting device of the present disclosure, the mounting head has multiple pickup members, and the control section causes the mounting head to pick up the components in a mounting order in which the mounting head holds multiple components on which the second placement process can be executed. In this mounting device, image processing is suppressed as much as possible by not making the mounting head hold components not requiring imaging mixed in with components requiring imaging. In this mounting device, the time required for the mounting process can be further reduced.

The information processing device of the present disclosure is an information processing device for use in a mounting system including any one of the above-described mounting devices comprising a setting section configured to set a mounting order in which multiple components are held in the mounting head, the components being components on which the second placement process can be executed. In this information processing device, image processing is suppressed as much as possible by not making the mounting head hold components not requiring imaging mixed in with components requiring imaging. In this information processing device, the time required for the mounting process can be further shortened.

The information processing device of the present disclosure is an information processing device used in a mounting system including any of the above described mounting devices, in which a setting section is configured to set mounting positions of multiple holding members at contiguous positions, each of the multiple holding members holding components on which the second placement process can be executed. In this information processing device, since the components requiring inspection in the supply section are arranged contiguously, it is easy to inspect the components.

The mounting method of the present disclosure is a mounting method for use in a mounting device comprising: a mounting head, having a pickup member picking up a component, which moves and places the component at a placement position by picking up the component with the pickup member from a supply section having a holding member holding the component;

an imaging section configured to image the component held by the mounting head; and the mounting method comprising: (a) a step of executing a first placement process in which the component is picked up by the mounting head, positional deviation is corrected based on imaging results of the component captured by the imaging section, and the component is placed at the placement position, and (b) a step of executing a second placement process in which the component is placed at the placement position by omitting the imaging process by the imaging section at the mounting head when the positional deviation is within a predetermined allowable range.

In this mounting method, similarly to the mounting device described above, mounting accuracy is ensured by correcting the positional deviation using the imaging results from the imaging section, whereas it is possible to shorten the time required for the mounting process by omitting the imaging process and, additionally, omit moving of the mounting head to the imaging section when a predetermined mounting accuracy can be ensured. In this mounting method, steps for performing the processes of any of the mounting devices described above may be added, or the configuration of any of the mounting devices described above may be adopted.

INDUSTRIAL APPLICABILITY

The mounting device, information processing device, and mounting method of the present disclosure can be used in the electronic component mounting field.

REFERENCE SIGNS LIST

10 Mounting system, 11 Mounting device, 12 Board processing section, 14 Component supply section, 15 Feeder, 15a First processing target feeder, 15b Second processing target feeder, 16 Component imaging section, 17 Inspection section, 18 Inspection imaging section, 19 Inspection moving section, 20 Mounting section, 21 Head moving section, 22 Mounting head, 23 Nozzle, 26 Mark imaging section, 31 Control section, 32 CPU, 33 Storage section, 34 Mounting condition information, 35 Component information, 41 Main body, 42 Bump, 50 Management PC, 51 Control section, 52 CPU, 53 Storage section, 54 Mounting condition information, 55 Component information, P Component, S Board.

The invention claimed is:

1. A mounting device, comprising:
a mounting head, having a pickup member picking up a component, which moves and places the component at a placement position by picking up the component with the pickup member from a supply section having a holding member holding the component;
an imaging section configured to image the component held by the mounting head; and
a control section configured to execute:
a first placement process in which the component is picked up by the mounting head, positional deviation is corrected based on imaging results of the component captured by the imaging section, and the component is placed at the placement position, and
a second placement process in which the component is placed at the placement position by omitting the imaging process by the imaging section at the mounting head when the positional deviation is within a predetermined allowable range.

2. The mounting device of claim 1, wherein the control section executes the second placement process after confirming that the positional deviations are within a predetermined allowable range for a predetermined number of times.

3. The mounting device of claim 1, wherein the control section executes the second placement process when an instruction permitting the second placement process is acquired from an operator.

4. The mounting device of claim 1, wherein the control section executes the first placement process when picking up a component from an exchanged holding member after a holding member of the supply section is exchanged during execution of the second placement process.

5. The mounting device of claim 1, further comprising:
an inspection section configured to inspect the component on the supply section;
the component being a component requiring inspection before placement; and
the control section executes the first placement process or the second placement process after inspection of the component is performed by the inspection section.

6. The mounting device of claim 5, wherein the supply section is installed with multiple holding members holding components on which the second placement process can be executed, and the inspection section has an imaging device configured to capture an image of the top of the supply section and execute inspection of the component based on the captured image.

7. The mounting device of claim 1, wherein the mounting head has multiple pickup members, and the control section causes the mounting head to pick up the components in a mounting order in which the mounting head holds multiple components on which the second placement process can be executed.

8. An information processing device for use in a mounting system comprising a mounting device of claim 1, further comprising a setting section configured to set a mounting order in which multiple components on which the second placement process can be executed are held in the mounting head.

9. An information processing device for use in a mounting system comprising the mounting device of claim 1, wherein the information processing device further comprises a setting section configured to set mounting positions of multiple holding members at contiguous positions, each of the multiple holding members holding components on which the second placement process can be executed.

10. A mounting method for use in a mounting device comprising: a mounting head, having a pickup member picking up a component, which moves and places the component at a placement position by picking up the component with the pickup member from a supply section having a holding member holding the component;
an imaging section configured to image the component held by the mounting head; and
the mounting method comprising:
(a) a step of executing a first placement process in which the component is picked up by the mounting head, positional deviation is corrected based on imaging results of the component captured by the imaging section, and the component is placed at the placement position, and
(b) a step of executing a second placement process in which the component is placed at the placement position by omitting the imaging process by the imaging section at the mounting head when the positional deviation is within a predetermined allowable range.

* * * * *